United States Patent [19]

Paik et al.

[11] Patent Number: 5,241,563
[45] Date of Patent: Aug. 31, 1993

[54] METHOD AND APPARATUS FOR COMMUNICATING INTERLEAVED DATA

[75] Inventors: Woo H. Paik, Encinitas; John M. Fox, San Diego; Scott A. Lery, Leucadia, all of Calif.

[73] Assignee: General Instrument Corporation, Hatboro, Pa.

[21] Appl. No.: 927,827

[22] Filed: Aug. 10, 1992

[51] Int. Cl.$^5$ .............................................. H04K 1/10
[52] U.S. Cl. ........................................ 375/1; 375/68; 380/34; 455/33.1; 370/18; 370/21; 370/22
[58] Field of Search ...................... 375/1, 68; 380/34; 455/33.1; 370/18, 21, 22

[56] References Cited

U.S. PATENT DOCUMENTS 5,060,266 10/1991 Dent .................................. 455/33.1
5,081,679 1/1992 Dent .................................. 455/33.1
5,103,459 4/1992 Gilhousen et al. .................. 375/1

OTHER PUBLICATIONS

Bernard Sklar, "Digital Communications Fundamentals and Applications", Prentice Hall, 1988, pp. 357–364.

Primary Examiner—David C. Cain
Attorney, Agent, or Firm—Barry R. Lipsitz

[57] ABSTRACT

An interleaver processes information in a pseudorandom order to provide pseudorandom interleaved data for communication to a deinterleaver. The pseudorandom interleaved data is processed at the deinterleaver in a pseudorandom order corresponding to that used at the interleaver means, to recover the original information. The pseudorandom processing at the deinterleaver is synchronized with the pseudorandom processing at the interleaver on a trial and error basis. In one embodiment, full synchronization occurs when a Viterbi decoder receiving data from the deinterleaver has a renormalization rate within a designated threshold and when enough synchronization words are detected in data output from the deinterleaver to meet a predetermined criterion. In another embodiment, a timer is used to initiate a new starting address for the pseudorandom processing at the deinterleaver during successive time intervals. Synchronization is achieved when a start address is found that results in the detection of enough synchronization words in data output from the deinterleaver to meet a predetermined synchronization criterion.

24 Claims, 5 Drawing Sheets

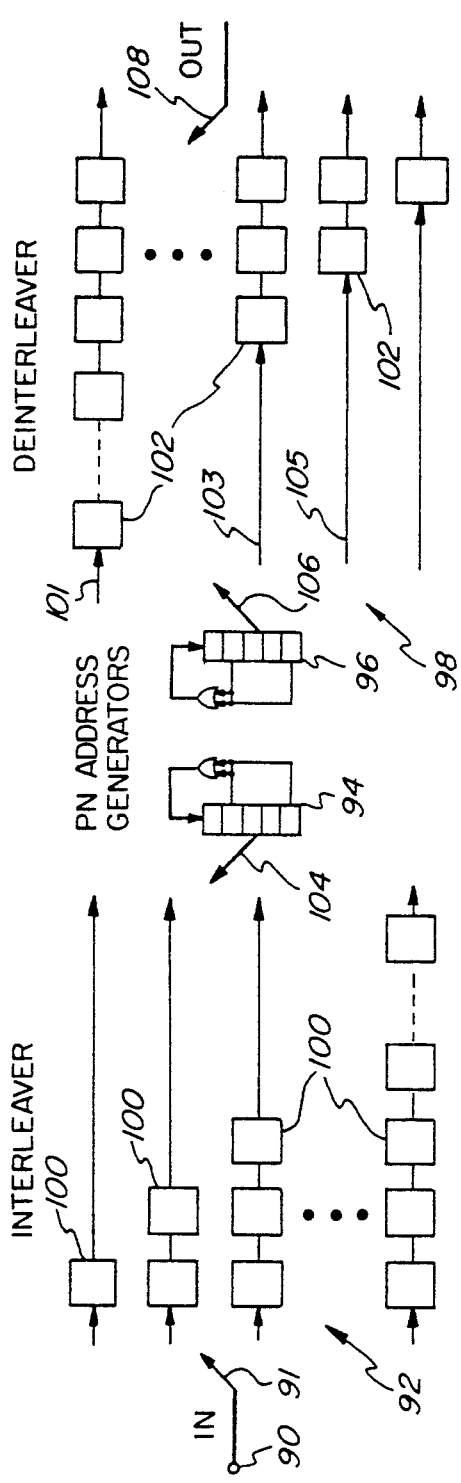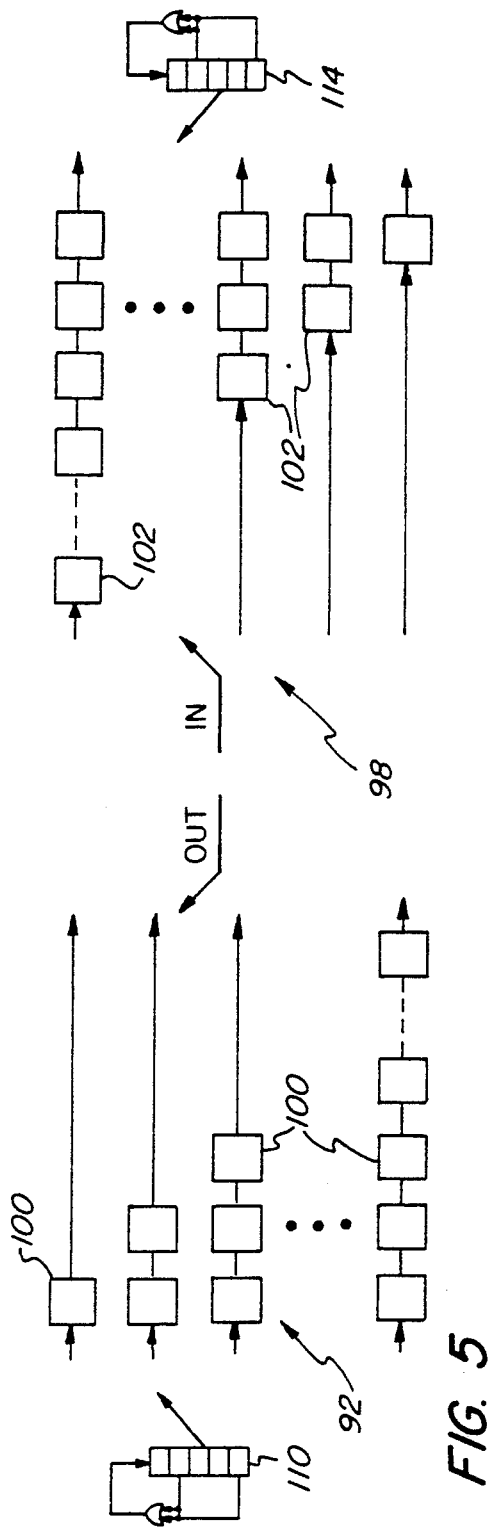
FIG. 4
FIG. 5

METHOD AND APPARATUS FOR COMMUNICATING INTERLEAVED DATA

BACKGROUND OF THE INVENTION

The present invention relates to the communication of digital data and more particularly to a pseudorandom convolutional interleaving technique and the synchronization of a convolutional deinterleaver.

Digital data can be communicated using various well known techniques. In some communication schemes, the data is encoded before transmission to provide "symbols" that are transmitted to a receiver, which decodes the symbols to recover the desired data.

In certain instances, the data channel over which data is communicated exhibits mutually dependent signal transmission impairments. An example of such a channel is one that fades in and out over time. Another type of impairment known as "multipath" occurs when signals arrive at a receiver over two or more paths of different lengths. The result is that that signals arrive out of phase with each other, distorting the cumulative received signal.

Switching noise and other burst noise can also appear on communication channels and degrade the performance of the communications equipment. All such time-correlated channel impairments result in a statistical dependence among successive data symbol transmissions. Thus, the disturbances tend to cause errors that occur in bursts, instead of isolated errors during a transmission. One technique for reducing such errors is the use of time diversity or "interleaving."

Interleaving digital data (e.g., codeword symbols representing coded information) before transmission and deinterleaving the data after reception causes bursts of channel errors to be spread out in time. This enables the receiver to treat the errors as if they were random errors. Thus, the idea behind the technique of interleaving is to separate successive symbols in time. The intervening times are filled by other symbols. Separating the symbols in time enables known random error correcting codes to be useful in correcting burst noise errors.

Various techniques are known for decoding transmitted symbols. One such technique is the well known Viterbi decoding algorithm, which uses the trellis structure of a convolutional code and systematically exploits the periodic remerging of the trellis paths to determine the survivors. For any convolutional code, the output of a Viterbi decoder is a sequence of estimated information digits which is maximum likelihood conditioned upon the received sequence. The Viterbi decoding algorithm is particularly suitable for decoding symbols transmitted over satellite channels. The Viterbi algorithm is explained in detail in G. D. Forney, Jr., "The Viterbi Algorithm," Proceedings of the IEEE, Vol. 61, No. 3, March 1973.

Conventional interleavers and deinterleavers are addressed sequentially. This means that the codeword symbols are input to the interleaver input ports and output from the interleaver output ports in an orderly, sequential fashion. Likewise, the interleaved symbols received via the communications channel are input to the deinterleaver input ports and output from the deinterleaver output ports in the same orderly sequential manner. A problem with this arrangement is that even when a sequentially addressed deinterleaver is not synchronized with the corresponding interleaver, it can still output runs of correctly deinterleaved symbols. If these runs are long enough, a Viterbi decoder following the deinterleaver may indicate false synchronization. In addition, an interleaver that is addressed sequentially can be defeated by interference that is pulsed at the same period as the interleaver address cycle. Such a situation will compromise the accuracy of the communication system.

It would be advantageous to provide an interleaving system that avoids the problems of false synchronization noted above. It would be further advantageous to provide a randomly addressed interleaver/deinterleaver structure, with a simple yet effective means for synchronizing the addressing of the deinterleaver to the addressing used at the interleaver. The present invention provides a synchronization scheme for use in a pseudorandom interleaver/deinterleaver structure which enjoys these advantages.

SUMMARY OF THE INVENTION

In accordance with the present invention, a method and apparatus are provided for communicating interleaved data. Data is written into a plurality of input ports of an interleaver, such as a convolutional interleaver, in a sequential order. Data is read from a plurality of output ports of the interleaver in a pseudorandom order to provide the data in a pseudorandom interleaved format. The pseudorandom interleaved data is communicated to a corresponding deinterleaver for input to a plurality of input ports in the pseudorandom order commencing at a first one of the input ports. A plurality of output ports of the deinterleaver is monitored in the sequential order to detect a first synchronization condition. In the event that the first synchronization condition is not detected, the interleaved data is input to the deinterleaver in the pseudorandom order commencing at different input ports until the first synchronization condition is detected.

In an illustrated embodiment, data written into the input ports of a convolutional interleaver includes periodic synchronization words. The first synchronization condition occurs when a Viterbi decoder receiving data from the deinterleaver has a renormalization rate within (e.g., below) a designated threshold. A second synchronization condition occurs when enough synchronization words are detected in data output from the deinterleaver to meet a predetermined criterion. For example, the criterion could be met when a designated number of successive synchronization words are detected over a certain time period in data output from the deinterleaver.

In a preferred embodiment, the renormalization rate threshold of the Viterbi decoder is raised when said second synchronization is met. In the event that said second synchronization condition is no longer met at some subsequent time, the renormalization rate threshold of the Viterbi decoder is lowered.

In another embodiment, data is written into a plurality of input ports of an interleaver in a pseudorandom order. Data is read from a plurality of output ports of the interleaver in a sequential order to provide the data in a pseudorandom interleaved format. The pseudorandom interleaved data is communicated to a corresponding deinterleaver for input to a plurality of input ports in said sequential order commencing at a first one of the input ports. A plurality of output ports of the deinterleaver is monitored in the pseudorandom order to detect a first synchronization condition. In the event that the first synchronization condition is not detected, data is output from the deinterleaver in the pseudorandom order commencing at different output ports until the first synchronization condition is detected. As with the first embodiment, the first synchronization condition can be detected by verifying that a Viterbi decoder downstream of the deinterleaver has a renormalization rate within a designated threshold. Other features of the first embodiment, including the use of a second synchronization condition to control the renormalization rate threshold, can also be provided in the alternate embodiment.

Apparatus in accordance with the invention comprises interleaver means for processing information in a pseudorandom order to provide pseudorandom interleaved data. Means are provided for communicating the pseudorandom interleaved data to a deinterleaver. The pseudorandom interleaved data is processed at the deinterleaver, in a pseudorandom order corresponding to that used at the interleaver means, to recover the information. Means are provided for synchronizing the pseudorandom processing at the deinterleaver with the pseudorandom processing at the interleaver.

The deinterleaver can comprise a plurality of input ports for receiving data in the pseudorandom order and a plurality of output ports for outputting data in a sequential order. Alternatively, the deinterleaver can comprise a plurality of input ports for receiving data in a sequential order and a plurality of output ports for outputting data in said pseudorandom order. The synchronization means are responsive to data output from the deinterleaver to detect a first synchronization condition. In the event that the first synchronization condition is not detected, the pseudorandom processing of data at the deinterleaver is commenced at different ports until the first synchronization condition is detected.

The first synchronization condition occurs when a Viterbi decoder receiving data from the deinterleaver has a renormalization rate within a designated threshold. A second synchronization condition occurs when enough synchronization words are detected in data output from the deinterleaver to meet a predetermined criterion. Means can be provided for raising the renormalization rate threshold when the second synchronization condition is met. Means can also be provided for continuing to monitor data output from the deinterleaver after the second synchronization condition occurs. The renormalization rate threshold is lowered in response to the data monitoring means if the second synchronization condition is no longer met.

Receiver apparatus is provided in accordance with the invention for recovering information from pseudorandom interleaved data. Deinterleaver means, coupled to receive the pseudorandom interleaved data at an input thereof, provides deinterleaved data from an output. A Viterbi decoder is coupled to receive data output from the deinterleaver means. Means are provided for comparing a renormalization rate of the Viterbi decoder to a threshold. Means are also provided for detecting and counting periodic synchronization words in the data output from the deinterleaver means. Means responsive to the comparing and counting means are provided for synchronizing the processing of pseudorandom data by the deinterleaver means such that the Viterbi decoder has a renormalization rate within a designated threshold and enough synchronization words are detected in the deinterleaved data output from the deinterleaver means to meet a predetermined criterion. In an illustrated embodiment, the deinterleaver means comprise a convolutional deinterleaver.

BRIEF DESCRIPTION OF THE DRAWINGS

FIG. 4 is a diagrammatic illustration of a pseudorandom interleaver/deinterleaver structure in accordance with the present invention;

FIG. 5 is a diagrammatic illustration of an alternate embodiment of a pseudorandom interleaver/deinterleaver in accordance with the present invention.

DETAILED DESCRIPTION OF THE INVENTION

The present invention provides a pseudorandom interleaver/deinterleaver wherein the deinterleaver is synchronized with the interleaver based on the renormalization rate of a Viterbi decoder and the detection of synchronization words in the deinterleaver output stream.

Figure 1:
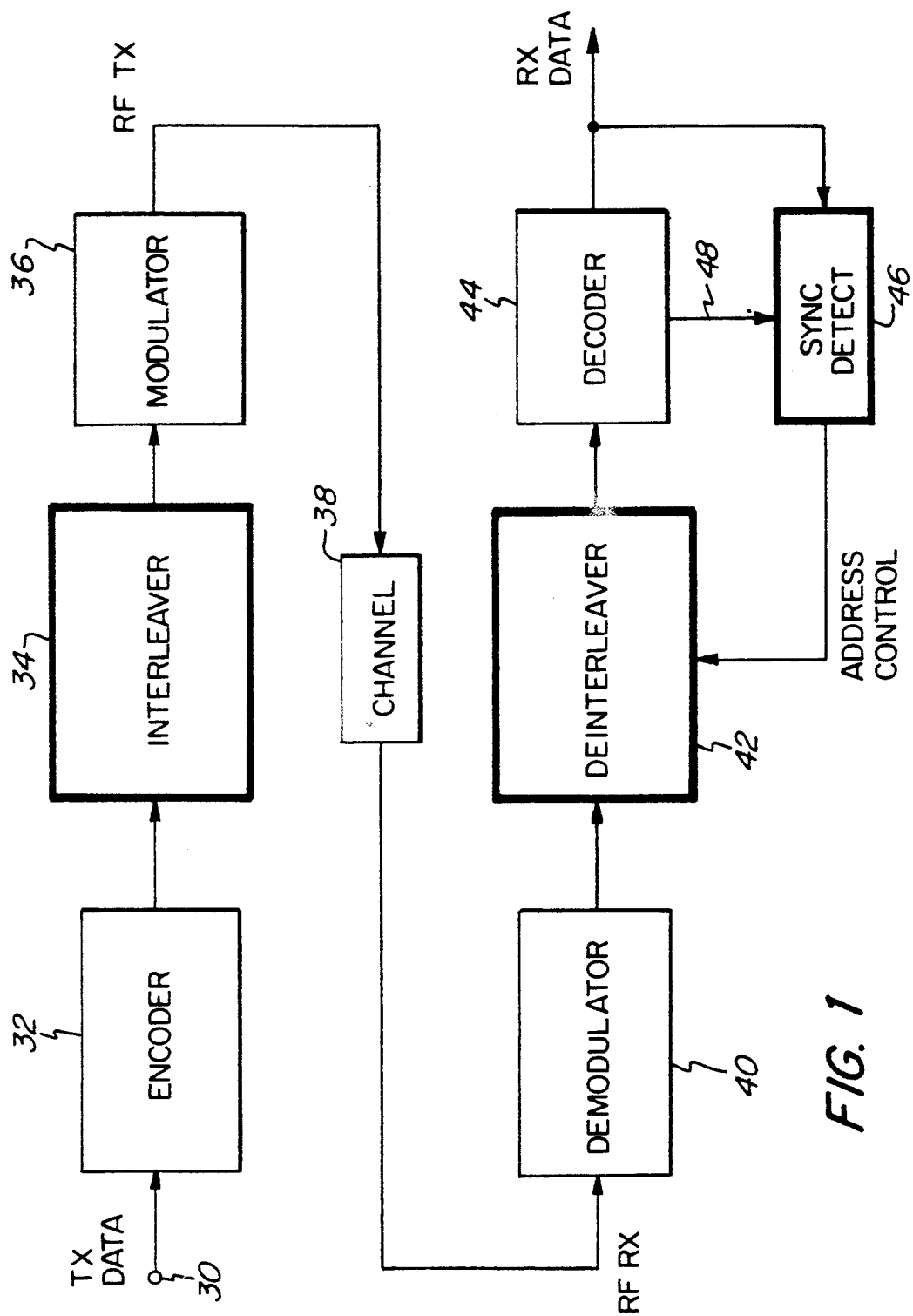
FIG. 1 is a block diagram of a communication system incorporating the present invention.

FIG. 1 illustrates a basic communication system using interleaving. Data to be transmitted is input at a terminal 30 for encoding by an encoder 32. Various types of encoders are well known, including those that employ concatenated coding schemes using, for example, a convolutional or trellis code as an inner code and a t-error-correcting "Reed-Solomon" code as an outer code. See, e.g., G. C. Clarke, Jr. and J. B. Cain, "Error-Correction Coding for Digital Communications," Plenum Press, New York, 1981 and S. Lin and D. J. Costello, Jr., "Error Control Coding: Fundamentals and Applications," Prentice-Hall, Englewood Cliffs, N.J., 1983.

The output of encoder 32 comprises codeword "symbols" that are input to an interleaver 34 where the codeword symbols are separated in time. Interleaving the coded message before transmission and deinterleaving after reception causes bursts of channel errors to be spread out in time, and therefore handled by the decoder as if they were random errors. This technique is useful in substantially reducing the error rate of a properly reconstructed received signal.

The interleaved symbols output from interleaver 34 are modulated in a conventional modulator 36 and transmitted in the radio frequency (RF) domain via a conventional communications channel 38. The modulated RF signal is received by a receiver that contains a conventional demodulator 40 that recovers the transmitted symbols. A deinterleaver 42 deinterleaves the symbols from demodulator 40, and outputs the deinterleaved data to a decoder 44. Where a trellis inner code was used at the encoder 32, decoder 44 can include a well known Viterbi decoder for use in recovering the original data input at terminal 30. In accordance with the present invention, synchronization detection subsystem 46 receives a control signal on line 48 from the Viterbi decoder indicative of the renormalization rate of the Viterbi decoder internal path metrics. The renormalization rate is an indicator of synchronization of those elements (e.g., the convolutional deinterleaver) preceding the Viterbi decoder, as well as an indicator of the synchronization of the Viterbi decoder itself. Every time the renormalization rate exceeds a preset threshold, the control signal is output to synchronization detection subsystem 46 via control line 48. The synchronization detection subsystem 46 also monitors the output of the decoder 44 to detect synchronization words contained in the transmitted data. As explained in greater detail below, the deinterleaver is assumed to be in synchronization with the interleaver when the Viterbi decoder has a renormalization rate within the designated threshold. When enough synchronization words are detected in data output from the deinterleaver to meet a predetermined criterion, the renormalization rate threshold is raised. For example, the criterion could be met when no more than a designated number of successive synchronization words are absent from data output from the deinterleaver after decoding by decoder 44. Or, the criterion could be met when a designated number of synchronization words are detected over a given time period.

In the event that sync has not been achieved, synchronization detection circuitry 46 will output an address control signal to deinterleaver 42, causing the next deinterleaver address to be tested as a possible sync state. Once sync is reached, it is assumed that the deinterleaver is being properly addressed, allowing proper recovery of the transmitted data.

Figure 2:
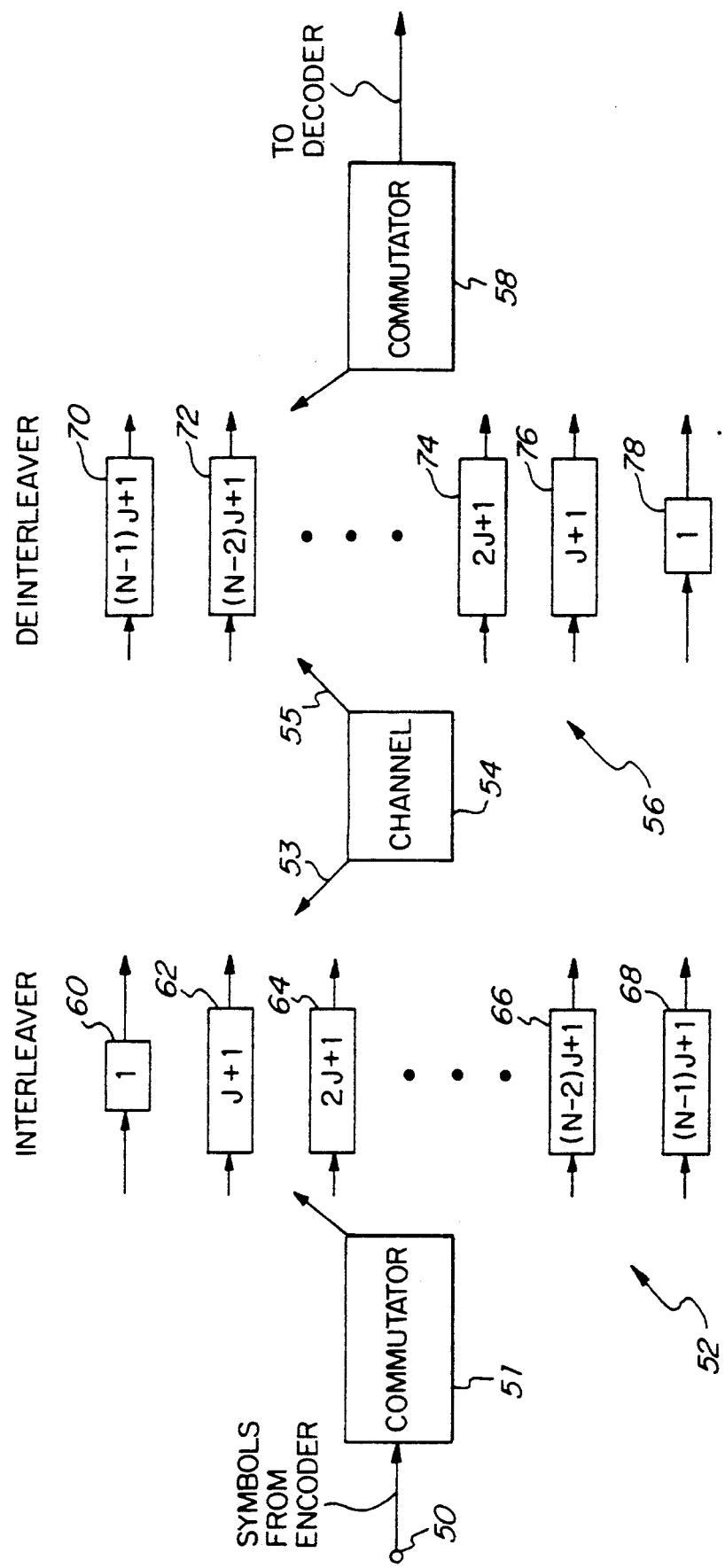
FIG. 2 is a diagrammatic illustration of a convolutional interleaver/deinterleaver structure.

A particular interleaver structure known as a convolutional interleaver is illustrated in FIG. 2. An interleaver generally designated 52 interleaves symbols input at terminal 50 for communication to a deinterleaver generally designated 56 via a communication channel 54. The symbols are shifted into a bank of N registers 60, 62, 64, ... 66, 68 via a commutator 51. Those skilled in the art will appreciate that commutator 51 is easily implemented using conventional digital hardware components. Each successive register in the interleaver provides J symbols more storage than does the preceding one. With each new symbol, the commutator 51 switches to a new register, and the oldest symbol in that register is shifted out for communication over channel 54 via another commutator 53. At the same time, the new symbol is shifted into the register. After the Nth register, the commutator 51 returns to the first register and starts again.

Deinterleaver 56 performs the inverse operation of interleaver 52. Interleaved symbols are received from the channel 54 via a commutator 55. The symbols are shifted into deinterleaver registers 70, 72, ... 74, 76, 78. A commutator 58 reads the symbols from the deinterleaver registers for output to a decoder. In order for proper operation, the input and output commutators for both interleaving and deinterleaving must be synchronized.

Figure 3A:
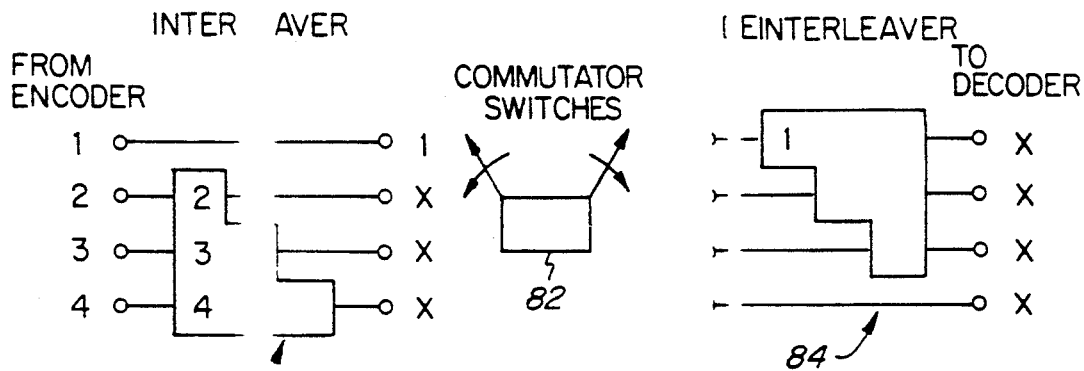
FIGS. 3a–3d illustrate, in diagrammatic form, an example of a simple convolutional four register interleaver being loaded by a sequence of code symbols.

FIGS. 3a–3d illustrate an example of a simple convolutional four-register (J=1) interleaver being loaded by a sequence of code symbols. The synchronized deinterleaver is shown simultaneously feeding the deinterleaved symbols to the decoder. In FIG. 3a, symbols 1–4 are being loaded into the interleaver generally designated 80. The "X" notation at the outputs represents unknown states. In the example of FIGS. 3a–3d, no delay is provided in the first row of the interleaver. Thus, symbol 1 input at interleaver 80 is immediately output to deinterleaver 84 via commutator switches 82.

Each of symbols 2, 3 and 4 illustrated in FIG. 3a are stored in corresponding first delay registers of interleaver 80. These symbols are not yet shifted out to the deinterleaver.

Figure 3B:
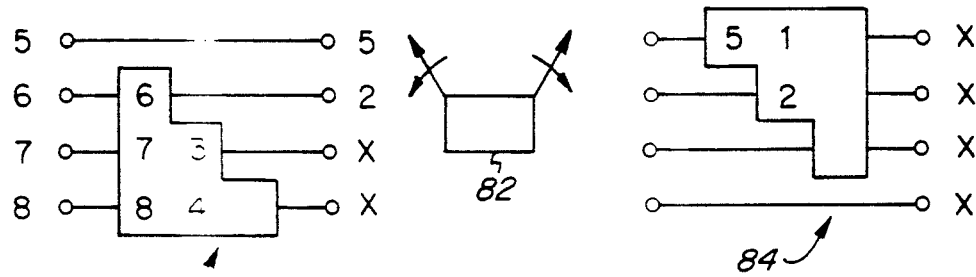

FIG. 3b illustrates the first four symbols shifted within the registers and the entry of symbols 5–8 to the interleaver input. As illustrated, since the interleaver and deinterleavers have not yet been fully loaded, the outputs of the deinterleaver 84 are all unknown states.

Figure 3C:
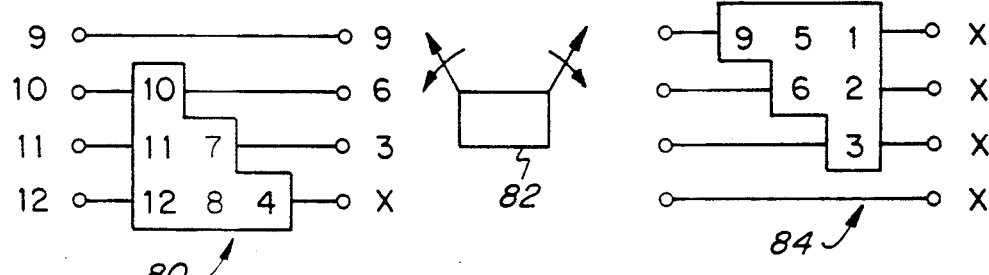

In FIG. 3c, symbols 9–12 are shown entering the interleaver 80. At this point, the deinterleaver 84 has been filled with message symbols, but nothing useful has yet been output to the decoder.

Figure 3D:
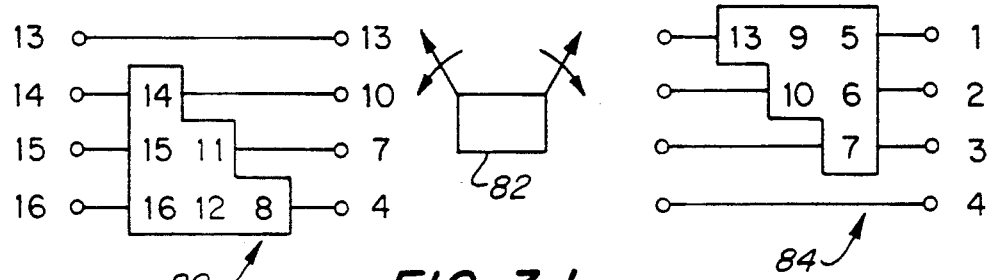

In FIG. 3d, symbols 13–16 are entering the interleaver, and at the output of deinterleaver 84, symbols 1–4 are finally being passed to the decoder. The process continues in this manner until an entire codeword sequence, in its original preinterleaved form, is presented to the decoder.

It should be noted that the symbols transmitted from interleaver 80 to deinterleaver 84 are not in their original order; they are interleaved. This can be seen, for example, at the output of interleaver 80 as depicted in FIG. 3d. Although the symbols have been input to the interleaver in order, they are output from interleaver 80 in the interleaved order 13, 10, 7, 4. Thus, burst errors among adjacent symbols will be spread out by the interleaver for transmission. At the deinterleaver, these symbols will be reassembled back into their correct order.

As noted above, it is imperative that the deinterleaver's commutator arms be synchronized with the interleaver's commutator arms. Such synchronization is provided by the present invention. In particular, the renormalization rate of a Viterbi decoder is used to effect different addressing of the deinterleaver by an orderly trial and error process until synchronization is achieved.

A first embodiment of the present invention is illustrated in FIG. 4. The convolutional interleaver/deinterleaver illustrated uses pseudorandom addressing, wherein the output commutator arm 104 of interleaver 92 and the input commutator arm 106 of deinterleaver 98 are controlled by a pseudorandom (PN) sequence by PN address generators 94, 96, respectively. Random addressing has the advantage that the interleaver will be more effective against periodic burst interference. In order to defeat the interleaver, the interference would have to follow the PN sequence, which is highly unlikely. In a random interleaver, the average spacing between adjacent symbols approaches the fixed spacing produced by a sequentially addressed interleaver, as the interleaver depth approaches infinity.

Symbols input to interleaver 92 via terminal 90 are sequentially loaded into registers 100 via input commutator arm 91. The pseudorandom interleaved data output from the interleaver is communicated over a communication channel to deinterleaver 98, where the symbols are loaded into registers 102. Interleaver 92 and deinterleaver 98 together comprise N×N registers. Half of the registers are in the interleaver and the other half in the deinterleaver, such that the interleaver and deinterleaver registers are separated along a diagonal line as shown. In this manner, each symbol will face the same amount of delay as it propagates from the input of interleaver 92 to the output of deinterleaver 98. At the deinterleaver output, an output commutator arm 108 sequentially retrieves the symbols for input to a Viterbi decoder.

It has been found that when a sequentially addressed deinterleaver is not in sync with the corresponding interleaver, it can output runs of correctly deinterleaved symbols. If these runs are long enough, the Viterbi decoder can indicate false sync. The present invention solves this problem by addressing the interleaver in a pseudorandom fashion. As a result, the runs of correctly deinterleaved signals when the interleaver and deinterleaver are not in synchronization are minimized, so that the Viterbi decoder does not indicate false sync.

Figure 6:
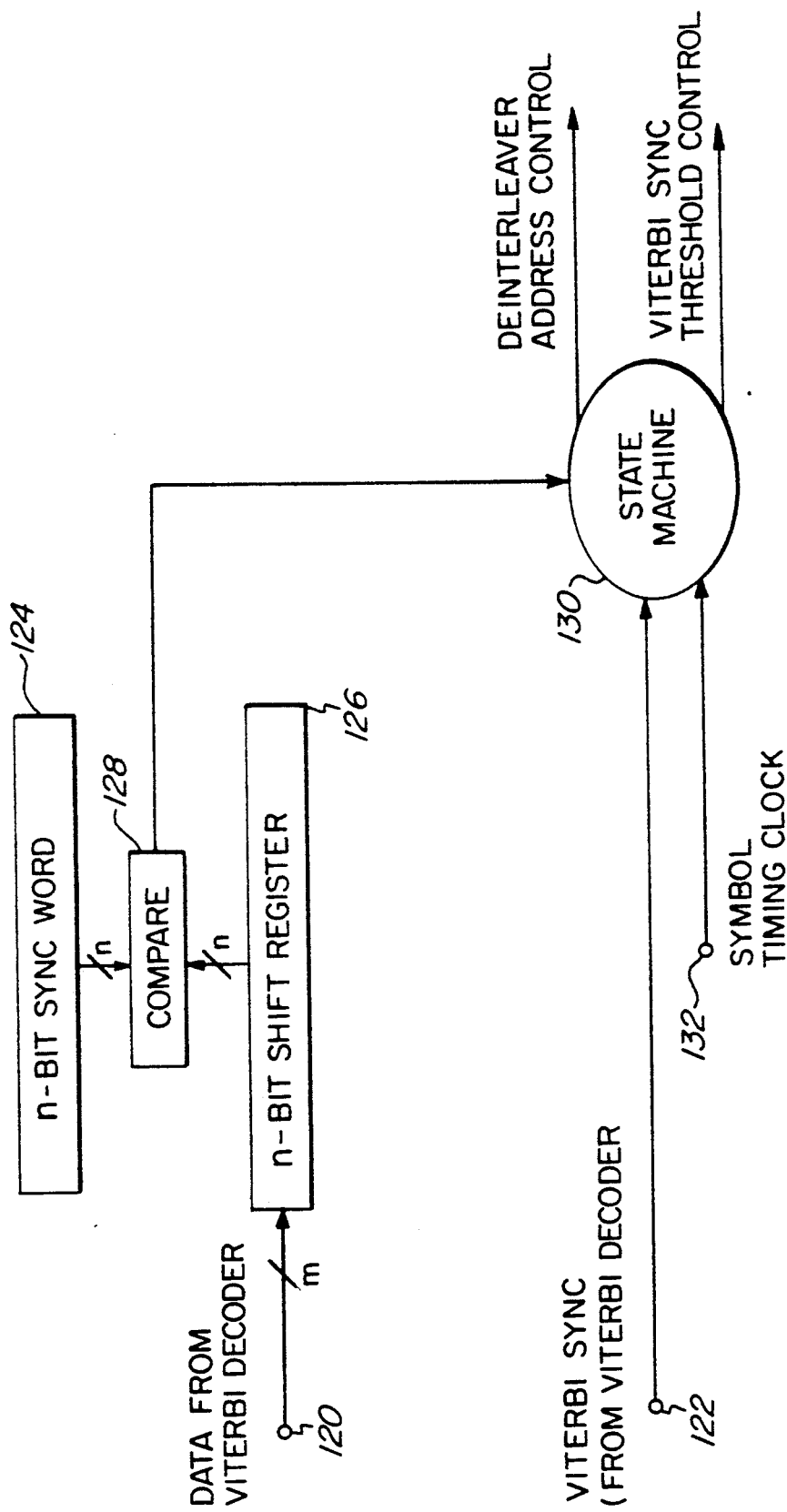
FIG. 6 is a block diagram illustrating the synchronization structure of a deinterleaver in accordance with the present invention.

FIG. 6 illustrates the steps involved in synchronizing the deinterleaver to the interleaver in accordance with the present invention. Data from the Viterbi decoder is input via terminal 120 to a 24 bit shift register 126. The synchronization control signal from the Viterbi decoder (i.e., the control signal indicating that the Viterbi renormalization rate has exceeded a preset threshold) is input at terminal 122. A state machine 130 determines when the Viterbi sync is indicating that the renormalization rate has exceeded its threshold. Upon this occurrence, state machine 130 signals the deinterleaver to cause the next deinterleaver address to be tested as a possible synchronization state. Thus, for example, if the deinterleaver input commutator 106 (FIG. 4) commences writing the interleaver data in the pseudorandom sequence to input path 101, and synchronization is not achieved, the system will attempt to achieve synchronization by commencing the pseudorandom sequence at input line 103. If this does not achieve synchronization, the deinterleaver will again try to achieve synchronization by commencing the pseudorandom sequence at input line 105. This process continues by addressing the different input lines of the deinterleaver on an orderly trial and error basis until synchronization is finally achieved.

In order to detect the synchronization condition, n-bit sync words comprising consecutive m-bit symbols are periodically transmitted and detected by comparator 128 (FIG. 6). The sync word is stored in nonvolatile memory 124, e.g., a read-only memory (ROM). The data from the Viterbi decoder is input to an n-bit shift register 126 via input terminal 120 and continuously compared by comparator 128 to the sync word stored in memory 124. In a specific embodiment, 24-bit sync words comprised of 4-bit symbols are transmitted about five percent of the time. Those skilled in the art will appreciate that these specific parameters are in no way critical, and the selection of the sync bit and symbol lengths as well as the frequency at which the sync words are transmitted will depend upon the particular throughput and overhead requirements of the system, with a view toward minimizing instances where the system incorrectly identifies a random bit pattern as a sync word.

Once the Viterbi decoder's renormalization rate control line indicates to the state machine that the renormalization rate is within an acceptable range (e.g., below a predetermined threshold), the state machine will lock the addressing of the deinterleaver at its current state. The state machine will then count how many sync words are detected in the data from the Viterbi decoder. If enough synchronization words are detected to meet a predetermined criterion, the state machine will raise the renormalization rate threshold of the Viterbi decoder to prevent the Viterbi decoder from falsely indicating that the system is out of sync. If the state machine subsequently determines that enough synchronization words are not being detected in the data output from the Viterbi decoder to meet the predetermined condition, it lowers the renormalization rate threshold of the Viterbi decoder so that synchronization can be reacquired.

One criterion for determining whether enough synchronization words are detected in the data from the Viterbi decoder is to provide a symbol timing clock signal to the state machine via terminal 132. This signal specifies a time period over which a given number of sync words should be detected. For example, if ten synchronization words are normally transmitted during a time "window" specified by the symbol timing clock signal, the predetermined criterion can be set to assume that synchronization has been achieved if eight synchronization words are detected during the window.

In a somewhat different embodiment, the predetermined criterion can be met if no more than a designated number of successive synchronization words are absent from the data output by the Viterbi decoder. In this embodiment, if the designated number of synchronization words in a row are not detected, the renormalization rate threshold is returned to its acquisition value and reacquisition occurs.

The specific number of synchronization words to be detected in order to meet the predetermined criterion is determined by the system requirements for acquisition time, detection/false alarm probabilities, and overhead. The lowering of the Viterbi decoder threshold by the state machine enables reacquisition of proper synchronization in the event that the symbol error rate increases to an unacceptable level.

The use of the Viterbi decoder renormalization rate to effect synchronization in accordance with the present invention reduces synchronization time. This is due to the fact that many deinterleaver addresses can be tried in a short period of time. The state machine will continue to try new addresses until the predetermined renormalization rate threshold is met. Typically, the renormalization rate of a Viterbi decoder is measured over 256 symbols. The memory of the Viterbi decoder is typically five constraint lengths (v). Thus, a new deinterleaver address can be tried every 256+5 v symbols. For example, if v is 6 (a 64 state Viterbi decoder) and the symbol rate is 5 MHz, a new address can be tried every 57.2 microseconds. Advantageously, no constraint is placed on the timing of the sync word with respect to the interleaver address cycle. Also, no constraint is placed on the interleaver address cycle with respect to other system timing.

An alternate embodiment of a pseudorandom interleaver/deinterleaver in accordance with the present invention is illustrated in FIG. 5. In this embodiment, instead of performing the pseudorandom processing at the output of the interleaver and the input to the deinterleaver, the pseudorandom addressing is provided at the input of the interleaver by PN address generator 110 and at the output of the deinterleaver by PN address generator 114. The output of the interleaver and input of the deinterleaver are both sequentially addressed. Apart from these differences, the operation of the embodiment of FIG. 5 is the same as the embodiment of FIG. 4.

In the embodiments described above, synchronization relies in part on the renormalization rate of a Viterbi decoder. In another embodiment, synchronization can be achieved in the absence of a Viterbi decoder. Specifically, in a concatenated coding system, an interleaver (deinterleaver) is placed between the inner and outer encoder (decoder) to break up bursts of errors into the outer decoder caused by the inner decoder. A timer is provided to try a new starting deinterleaver address after a predetermined time interval has elapsed. New addresses are tried at the beginning of each new time period, until enough synchronization words are detected in data output from the deinterleaver. At this point, the timer is disabled. In the event that the predetermined criterion is no longer met, the timer will be restarted to reacquire synchronization by trying new starting deinterleaver addresses.

The predetermined time interval established by the timer is equal to the period of the sync word transmission. Accordingly, a system in accordance with the timer embodiment may not run as fast as the method employing a Viterbi decoder, unless the synchronization words are transmitted at a high rate. This is due to the fact that only one address is tried between synchronization words, whereas in the Viterbi decoder method, several addresses can be tried between synchronization words.

As with the embodiment employing a Viterbi decoder, the timer implementation benefits from using random addressing. Specifically, even when not properly synchronized, the deinterleaver can output runs of correctly deinterleaved symbols, which could be detected as valid synchronization words if the synchronization word size is not long enough. This would cause the deinterleaver to remain in a false synchronization state. This problem can be solved by making the synchronization word as large as the interleaver address cycle (in symbols), a solution that is not usually desirable. As an alternative, the problem can be solved by positioning the sync word across the interleaver address cycles. By using random addressing, no constraint is placed on the position of the sync word, and the false sync problem can be accommodated without increasing system complexity.

It should now be appreciated that the present invention provides a method and apparatus for communicating interleaved data. An interleaver and deinterleaver are addressed on a pseudorandom basis. Data output from the deinterleaver is monitored (e.g., after decoding) to detect synchronization. In an embodiment utilizing a Viterbi decoder at the output of the deinterleaver, the renormalization rate of the Viterbi decoder is used in combination with the detection of synchronization words to obtain synchronization. If the Viterbi renormalization rate indicates that the deinterleaver is not in sync with the interleaver, a new starting address is tried for the pseudorandom input or output of data to/from the deinterleaver. If the renormalization rate indicates that synchronization may have been achieved, the data output from the deinterleaver is monitored to detect synchronization words. If the deinterleaver is properly deinterleaving the received data, the synchronization words will be detected. If enough synchronization words are detected to meet a predetermined criterion, synchronization is assumed and the renormalization rate threshold is substantially increased to prevent the Viterbi decoder from indicating a nonsynchronized condition.

The output of the deinterleaver is continuously monitored, and in the event that enough synchronization words are subsequently not detected to meet the predetermined criterion, the renormalization rate threshold of the Viterbi decoder is lowered so that synchronization can be reacquired. In this manner, the Viterbi decoder controls the addressing of the deinterleaver on an orderly trial and error basis to obtain the proper starting address for synchronization.

Although the invention has been described in connection with various specific embodiments, those skilled in the art will appreciate that various adaptations and modifications may be made thereto without departing from the spirit and scope of the invention as set forth in the claims.

We claim:

1. A method for communicating interleaved data comprising the steps of:
    writing data into a plurality of input ports of an interleaver in a sequential order;
    reading data from a plurality of output ports of said interleaver in a pseudorandom order to provide said data in a pseudorandom interleaved format;
    communicating the pseudorandom interleaved data to a deinterleaver for input to a plurality of input ports in said pseudorandom order commencing at a first one of said input ports;
    monitoring a plurality of output ports of said deinterleaver in said sequential order to detect a first synchronization condition and, in the event that said first synchronization condition is not detected,
    inputting said interleaved data to said deinterleaver in said pseudorandom order commencing at different input ports until said first synchronization condition is detected.

2. A method in accordance with claim 1 wherein said first synchronization condition occurs when:
    a Viterbi decoder receiving data from said deinterleaver has a renormalization rate within a designated threshold.

3. A method in accordance with claim 2 wherein the data written into the input ports of said interleaver includes periodic synchronization words, and a second synchronization condition occurs when enough synchronization words are detected in data output from said deinterleaver to meet a predetermined criterion, said method comprising the further step of:
    raising said renormalization rate threshold when said second synchronization condition occurs.

4. A method in accordance with claim 3 comprising the further steps of:
    continuing to monitor data output from said deinterleaver after said second synchronization condition occurs; and
    lowering said renormalization rate threshold if said predetermined criterion is no longer met.

5. A method in accordance with claim 1 wherein:
    the data written into the input ports of said interleaver includes periodic synchronization words; and
    said inputting step commences the input of said interleaved data at different input ports during successive time intervals until a starting input port is found that results in the detection of enough of said synchronization words in data output from said deinterleaver to meet a predetermined synchronization criterion.

6. A method for communicating interleaved data comprising the steps of:
    writing data into a plurality of input ports of an interleaver in a pseudorandom order;
    reading data from a plurality of output ports of said interleaver in a sequential order to provide said data in a pseudorandom interleaved format;

communicating the pseudorandom interleaved data to a deinterleaver for input to a plurality of input ports in said sequential order commencing at a first one of said input ports;

monitoring a plurality of output ports of said deinterleaver in said pseudorandom order to detect a first synchronization condition and, in the event that said first synchronization condition is not detected, outputting data from said deinterleaver in said pseudorandom order commencing at different output ports until said first synchronization condition is detected.

7. A method in accordance with claim 6 wherein said first synchronization condition occurs when:

a Viterbi decoder receiving data from said deinterleaver has a renormalization rate within a designated threshold.

8. A method in accordance with claim 7 wherein the data written into the input ports of said interleaver includes periodic synchronization words, and a second synchronization condition occurs when enough synchronization words are detected in data output from said deinterleaver to meet a predetermined criterion, said method comprising the further step of:

raising said renormalization rate threshold when said second synchronization condition occurs.

9. A method in accordance with claim 8 comprising the further steps of:

continuing to monitor data output from said deinterleaver after said second synchronization condition occurs; and lowering said renormalization rate threshold if said predetermined criterion is no longer met.

10. A method in accordance with claim 6 wherein:

the data written into the input ports of said interleaver includes periodic synchronization words; and said outputting step commences the output of data at different output ports during successive time intervals until a starting output port is found that results in the detection of enough of said synchronization words in data output from said deinterleaver to meet a predetermined synchronization criterion.

11. Apparatus for communicating interleaved data comprising:

interleaver means for processing information in a pseudorandom order to provide pseudorandom interleaved data;

means for communicating the pseudorandom interleaved data to a deinterleaver;

means for processing the pseudorandom interleaved data at said deinterleaver, in a pseudorandom order corresponding to that used at said interleaver means, to recover said information; and means for synchronizing the pseudorandom processing at said deinterleaver with the pseudorandom processing at said interleaver.

12. Apparatus in accordance with claim 11 wherein:

said deinterleaver comprises a plurality of input ports for receiving data in said pseudorandom order and a plurality of output ports for outputting data in a sequential order;

said synchronizing means are responsive to data output from said deinterleaver to detect a first synchronization condition; and in the event that said first synchronization condition is not detected, the pseudorandom input of data to said deinterleaver is commenced at different input ports until said first synchronization condition is detected.

13. Apparatus in accordance with claim 12 wherein said synchronization condition occurs when:

a Viterbi decoder receiving data from said deinterleaver has a renormalization rate within a designated threshold.

14. Apparatus in accordance with claim 13 wherein the data written into the input ports of said interleaver includes periodic synchronization words, and a second synchronization condition occurs when enough synchronization words are detected in data output from said deinterleaver to meet a predetermined criterion, said apparatus further comprising:

means for raising said renormalization rate threshold when said second synchronization condition occurs.

15. Apparatus in accordance with claim 14 further comprising:

means for continuing to monitor data output from said deinterleaver after said second synchronization condition occurs; and means for lowering said renormalization rate threshold if said predetermined criterion is no longer met.

16. Apparatus in accordance with claim 11 wherein:

said deinterleaver comprises a plurality of input ports for receiving data in a sequential order and a plurality of output ports for outputting data in said pseudorandom order;

said synchronizing means are responsive to data output from said deinterleaver to detect a first synchronization condition; and in the event that said first synchronization condition is not detected, the pseudorandom output of data from said deinterleaver is commenced at different output ports until said first synchronization condition is detected.

17. Apparatus in accordance with claim 16 wherein said synchronization condition occurs when:

a Viterbi decoder receiving data from said deinterleaver has a renormalization rate within a designated threshold.

18. Apparatus in accordance with claim 17 wherein the data written into the input ports of said interleaver includes periodic synchronization words, and a second synchronization condition occurs when enough synchronization words are detected in data output from said deinterleaver to meet a predetermined criterion, said apparatus further comprising:

means for raising said renormalization rate threshold when said second synchronization condition occurs.

19. Apparatus in accordance with claim 18 further comprising:

means for continuing to monitor data output from said deinterleaver after said second synchronization condition occurs; and means for lowering said renormalization rate threshold if said predetermined criterion is no longer met.

20. Apparatus in accordance with claim 11 wherein:

said interleaver means comprise a convolutional interleaver; and said deinterleaver comprises a convolutional deinterleaver.

21. Receiver apparatus for recovering information from pseudorandom interleaved data comprising:

deinterleaver means, coupled to receive said pseudo-random interleaved data at an input thereof, for providing deinterleaved data from an output;

a Viterbi decoder coupled to receive data output from said deinterleaver means;

means for comparing a renormalization rate of said Viterbi decoder to a threshold;

means for detecting and counting periodic synchronization words in the data output from said deinterleaver means; and means responsive to said comparing and counting means for synchronizing the processing of pseudo-random data by said deinterleaver means such that said Viterbi decoder has a renormalization rate within a designated threshold and enough synchronization words are detected in data output from said deinterleaver to meet a predetermined criterion.

22. Apparatus in accordance with claim 21 further comprising:

means for raising said renormalization rate threshold when said predetermined criterion is met.

23. Apparatus in accordance with claim 22 further comprising:

means for continuing to monitor data output from said deinterleaver means after said renormalization rate threshold is raised by said raising means; and means responsive to said monitor means for lowering said renormalization rate threshold if said predetermined criterion is no longer met.

24. Apparatus in accordance with claim 21 wherein said deinterleaver means comprise a convolutional deinterleaver.

* * * * *